United States Patent [19]
Tada

[11] Patent Number: 5,986,920
[45] Date of Patent: Nov. 16, 1999

[54] FERROELECTRIC MEMORY DEVICE AND METHOD OF REDUCING IMPRINT EFFECT THEREOF

[75] Inventor: Yoshihiro Tada, Kyoto, Japan

[73] Assignee: Rohm Co., Ltd., Kyoto, Japan

[21] Appl. No.: 09/197,347

[22] Filed: Nov. 19, 1998

[30] Foreign Application Priority Data

Nov. 26, 1997 [JP] Japan ..................................... 9-324068

[51] Int. Cl.$^6$ ............................ G11C 11/22; G11C 11/24
[52] U.S. Cl. ............................................ 365/145; 365/149
[58] Field of Search ..................................... 365/145, 149

[56] References Cited

U.S. PATENT DOCUMENTS

| | | | |
|---|---|---|---|
| 5,745,403 | 4/1998 | Taylor | 365/145 |
| 5,835,399 | 11/1998 | Jeon | 365/145 |
| 5,835,400 | 11/1998 | Jeon et al. | 365/145 |
| 5,883,828 | 3/1999 | Cuchiaro et al. | 365/145 |

*Primary Examiner*—Trong Phan
*Attorney, Agent, or Firm*—Merchant & Gould P.C.

[57] ABSTRACT

A ferroelectric memory device which is less likely to be affected with imprint effect and a highly effective method for reducing the imprint effect of the ferroelectric memory cell. A data reversing latch circuit is disposed between a pair of bit lines BL0 and /BL0 and has capacitors C1 and C2. When data is read, it is possible to store the potentials on the pair of bit lines BL0 and /BL0 as charges in the capacitors C1 and C2, and to reverse the high-low relationship between the potentials on the bit lines BL0 and /BL0 and then back to the original relationship according to stored charges in the capacitors C1 and C2. In this way, the imprint effect of the memory cell MO may be automatically reduced when data is read by reversing the data in the memory MO connected to the bit lines BL0 and /BL0 and again reversing the data back to normal.

19 Claims, 9 Drawing Sheets

FERROELECTRIC MEMORY DEVICE AND METHOD OF REDUCING IMPRINT EFFECT THEREOF

CROSS-REFERENCE TO RELATED APPLICATION

The entire disclosure of the Japanese Patent Application No. Hei 9-324068 filed on Nov. 26, 1997 including the specification, claims, drawings, and summary are incorporated herein by reference in its entirety.

BACKGROUND OF THE INVENTION

1. Field of the Invention

This invention relates to a ferroelectric memory device adapted to reduce a lasting effect or imprint effect of ferroelectric memory cells. The present invention is also directed to a method of reducing a lasting effect or imprint effect of ferroelectric memory cells.

2. Description of the Prior Art

Ferroelectric memories using ferroelectric capacitors are known as nonvolatile semiconductor memories. Generally, the semiconductor memory including the ferroelectric memory is constituted with a plurality of memory cells arranged in rows and columns, with each memory cell constituting a single memory unit (a bit).

FIG. 9 shows an example of circuit constitution in the vicinity of a memory cell 2 constituting a conventional ferroelectric memory. This memory cell 2 is of the so-called "2-transistor, 2-capacitor type." The memory cell 2 is provided with a pair of cells 4 and 6. The cell 4 is provided with a ferroelectric capacitor 8. The cell 6 is constituted similarly to the cell 4 and provided with a ferroelectric capacitor 10.

FIG. 8 generally shows a hysteresis curve representing the relationship between the voltage and polarized state (electric charge) for the ferroelectric capacitor. The relationship between the voltage (the potential of the bit line BL or /BL relative to the reference voltage of the plate line PL shown in FIG. 9) and the polarized state (shown in the figure with the "electric charge" which is equivalent to the "polarized state") for the ferroelectric capacitor 8 or 10 can be represented using FIG. 8.

In FIG. 8, the state with a residual polarization Z1 is assumed as the polarized state P1, and the state with a residual polarization Z2 is assumed as the polarized state P2. The ferroelectric capacitors 8 and 10 are constituted so that they are in the polarized state P1 or P2 when no potential difference exists between their both ends.

For example, when the ferroelectric capacitor 8 is in the polarized state P1, the ferroelectric capacitor 10 is in the polarized state P2 (The state is assumed to correspond to a stored data "H."). On the other hand, when the ferroelectric capacitor 8 is in the polarized state P2, the ferroelectric capacitor 10 is in the polarized state P1 (This state is assumed to correspond to a stored data "L.").

When the polarized states of the ferroelectric capacitors 8 and 10 are known, the data stored in the memory cell 2 can be known (read).

In order to know the polarized states of the ferroelectric capacitors 8 and 10, voltages Vf1 and Vf2 produced between both ends of the ferroelectric capacitors 8 and 10 may be measured after discharging a loading capacitor (parasitic capacitances of the bit lines BL and /BL) 12, followed by bringing the bit lines BL and /BL to floating state, and applying a reading voltage Vp to the plate line PL.

According to a graphical solution using FIG. 8, when the capacitance of the loading capacitor 12 is represented with the slope of the straight line L1, if the ferroelectric capacitor 8 is in the first polarized state P1, the voltage Vf1 produced between both ends of the ferroelectric capacitors 8 becomes V1. On the other hand, if the ferroelectric capacitor 10 is in the second polarized state P2, the voltage Vf2 becomes V2. A sensing amplifier 14 is used to know the polarized states the ferroelectric capacitors 8 and 10 are in by measuring which of the voltages Vf1 and Vf2 is greater at the time of reading.

In this way, stored data ("H" or "L") corresponding to the polarized states of the ferroelectric capacitors 8 and 10 can be read by checking the polarized states.

However, a problem associated with the conventional ferroelectric memory described above is that the ferroelectric has the property of producing distortion (lasting effect or imprint effect) on its hysteresis curve when the ferroelectric is held in the polarized state for an extended period of time.

Therefore, when a data is left stored for a long period of time, the lasting effect or imprint effect occurs in the ferroelectric capacitors 8 and 10 which constitute the memory cell 2. When such an effect occurs, the voltage values Vf1 and Vf2 produced between both ends of the ferroelectric capacitors 8 and 10 vary. In particular, when a data is stored which is opposite to the data stored when the imprint effect occurred, it is difficult to correctly read the opposite data. That is to say, the function of the memory device deteriorates with time.

SUMMARY OF THE INVENTION

It is an object of the present invention to provide a ferroelectric memory device which is less vulnerable to the imprint effect.

Another object of this invention is to provide a highly effective method of reducing the imprint effect of the ferroelectric memory cell.

In accomplishing the foregoing objects, the present invention provides a ferroelectric memory device comprising at least one ferroelectric memory cell storing information by holding a polarized state corresponding to said information, and means for performing an imprint effect reducing operation for a specified number of times when said information is written or read, with the imprint effect reducing operation comprising the steps of changing the polarized state of said ferroelectric memory cell to a state which is different from the polarized state to be held, and changing the polarized state thereof back to the original polarized state.

The present invention also provides a method of reducing an imprint effect of a ferroelectric memory cell capable of storing data by holding a polarized state corresponding to information, wherein, when writing or reading the information, an operation of reducing the imprint effect is repeated for a specified number of times. The operation comprises the step of reversing the polarized state of the ferroelectric memory cell, and the step of changing the reversed state back to the original state.

BRIEF DESCRIPTION OF THE DRAWINGS

Other objects, features and advantages of the present invention will become apparent from the detailed description of the preferred embodiments of the invention which follows, when considered in light of the accompanying drawings in which.

DETAILED DESCRIPTION OF THE PREFERRED EMBODIMENTS OF THE INVENTION

Figure 1:
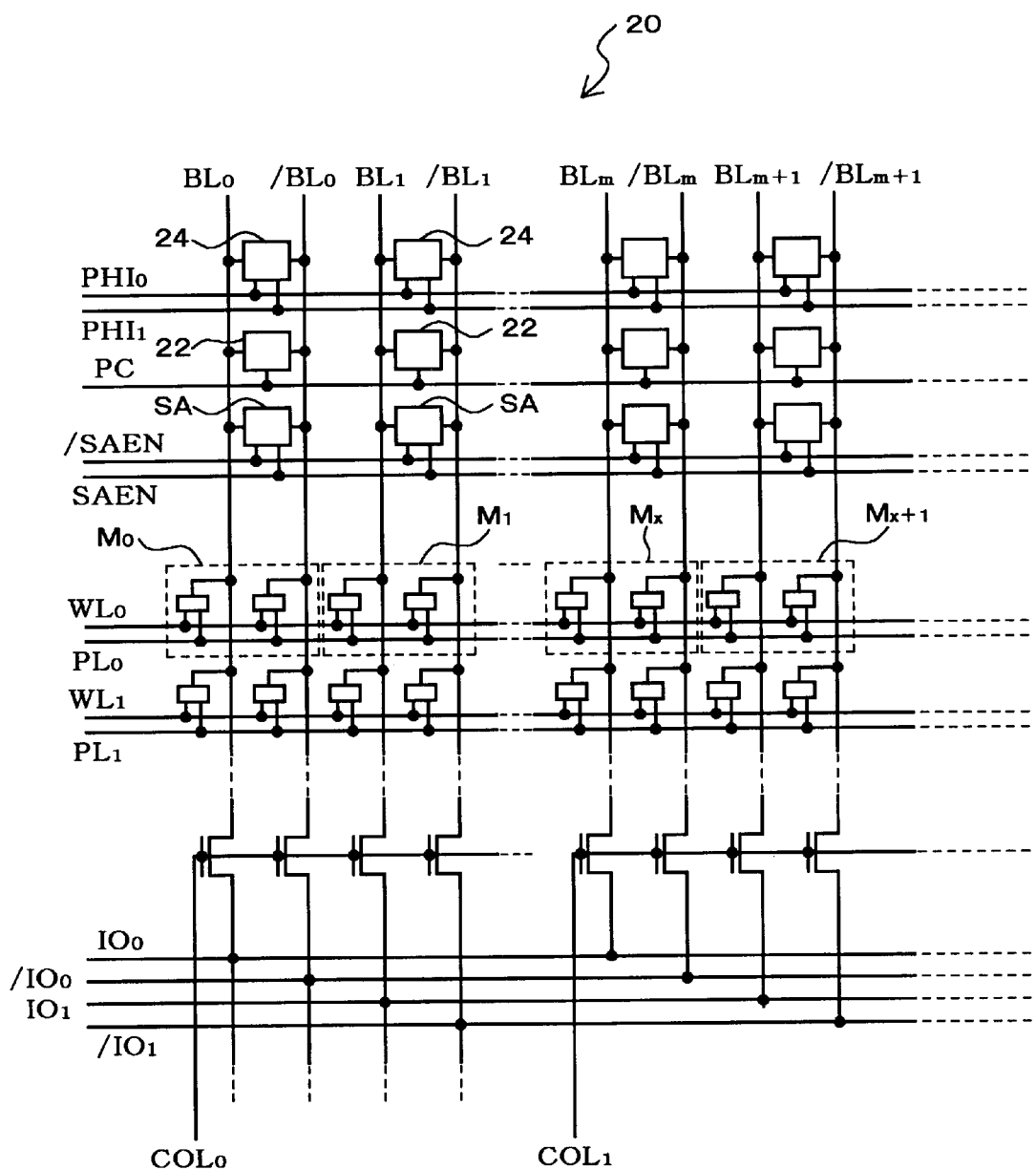
FIG. 1 is a partial view of the constitution of a ferroelectric memory 20 as an embodiment of this invention.

First Embodiment:

FIG. 1 shows part of the constitution of a ferroelectric memory 20 as an embodiment of this invention. The ferroelectric memory 20 is constituted with a plurality of ferroelectric memory cells M0, M1, . . . arranged in rows and columns. Each of the memory cells M0, M1, . . . is of the so-called 2-transistor, 2-capacitor type.

Each memory cell is disposed at the intersection of a word line and a pair of bit lines. For example, the memory cell M0 is located at the intersection of a word line W0 and a pair of bit lines BL0 (first bit line) and /BL0 (second bit line).

This embodiment is constituted that a plurality (m-number) of memory cells may be accessed at a time. Namely, the m-number of memory cells that can be accessed at a time are accessed with a word line and a column selection line. For example, by selecting the word line W0 and the column selection line COL0, memory cells M0, M1, . . . , Mm−1 (not shown) may be selected. Data may be written to or read from the m-number of memory cells at the same time.

Data may be transferred between m-number of memories (for example M0, M1, . . . , Mm−1) and outside through m-pairs of data communication lines or input-output lines IO0. /IO0, . . . , IOm−1, /IOm−1 (not shown) and m-pairs of bit lines BL0, /BL0, . . . , BLm−1, /BLm−1 (not shown) selected.

Figure 2:
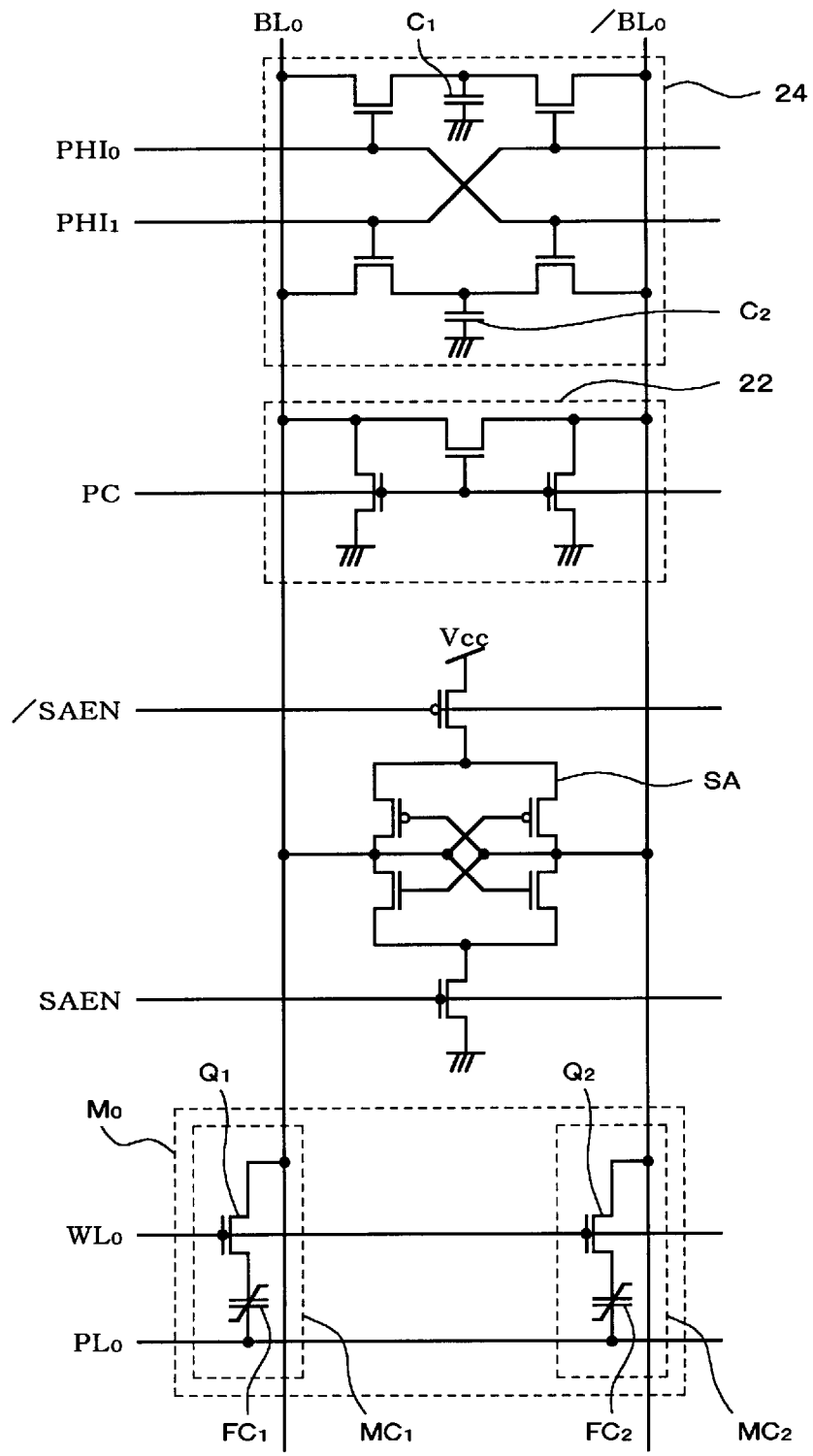
FIG. 2 is a detailed circuit diagram in the vicinity of a pair of bit lines BL0 and /BL0 constituting the ferroelectric memory 20 shown in FIG. 1.
Figure 8:
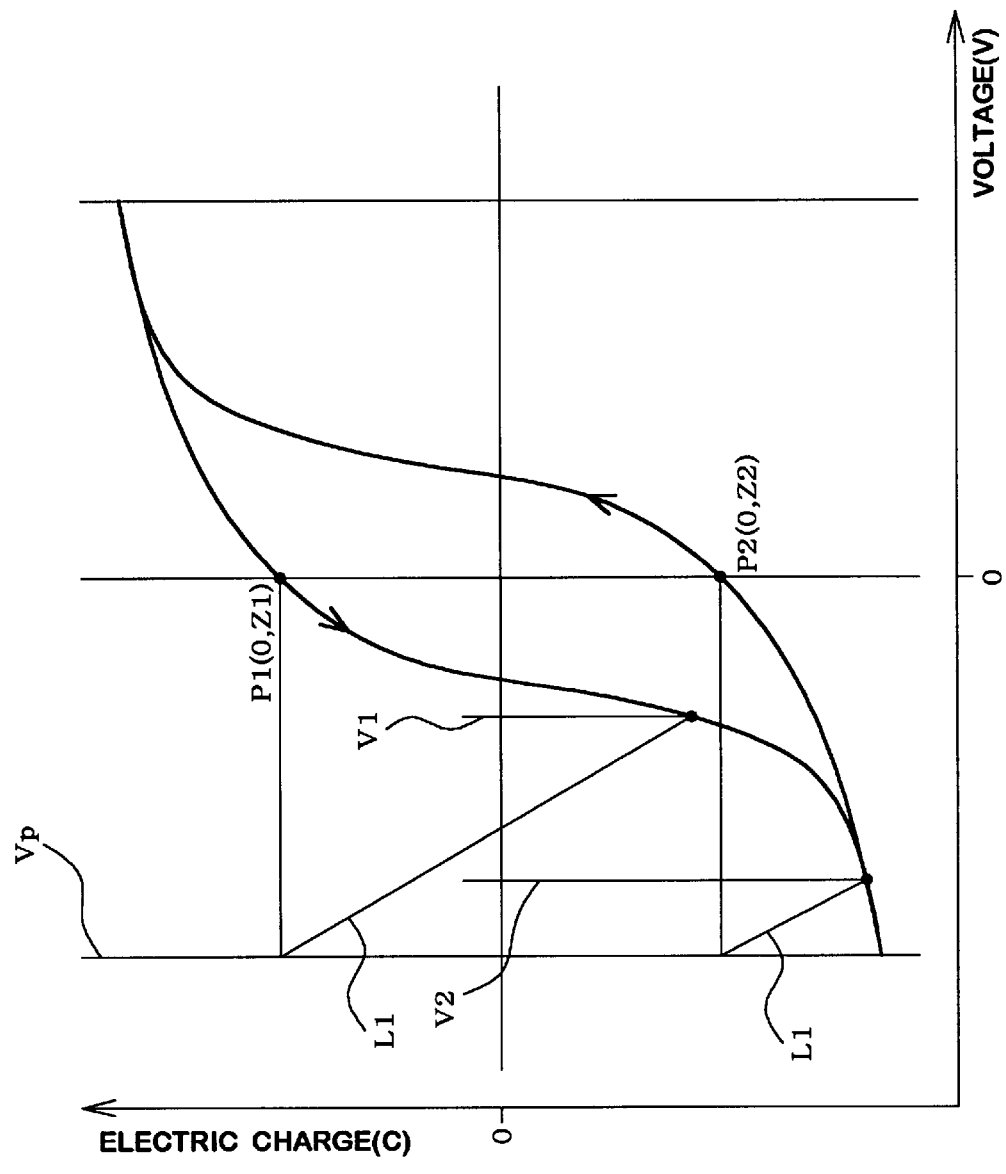
FIG. 8 is a hysteresis curve generally showing the relationship between the voltage and polarized state (electric charge) for a ferroelectric capacitor.
Figure 9:
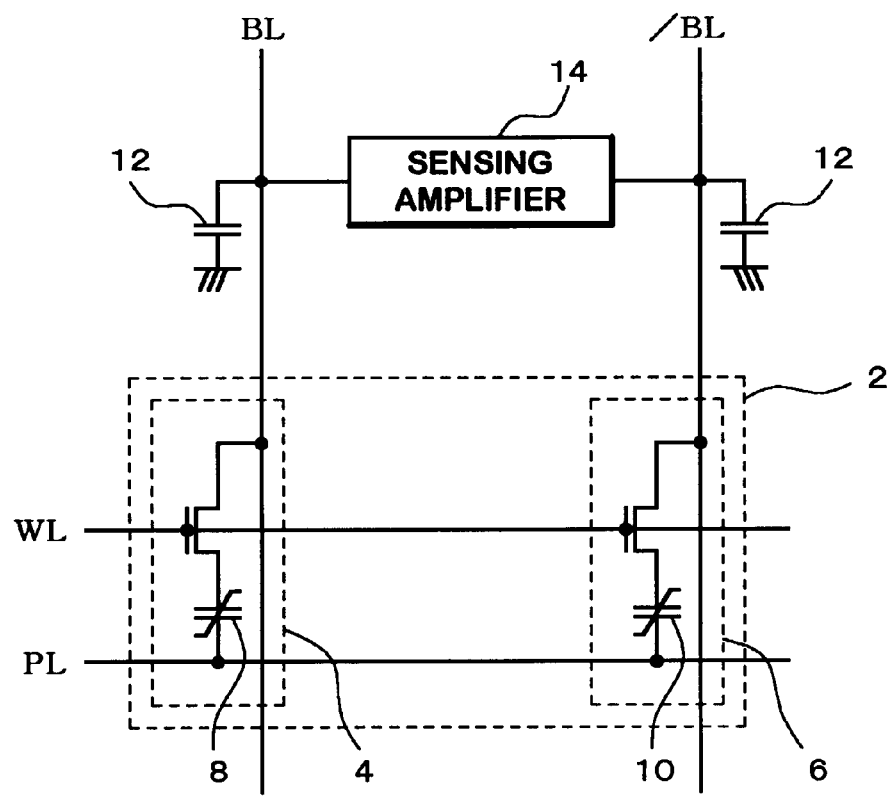
FIG. 9 is an example of circuit constitution in the vicinity of a memory cell 2 constituting a conventional ferroelectric memory.

FIG. 2 shows a detailed circuit diagram in the vicinity of the paired bit lines BL0 and /BL0. The memory cell M0 comprises a pair of sub-cells MC1 and MC2. The sub-cell MC1 comprises a first ferroelectric memory element or ferroelectric capacitor FC1 and a transistor Q1 (first transistor). The cell M2 similarly comprises a second ferroelectric memory element or ferroelectric capacitor FC2 and a transistor Q2 (second transistor). A voltage Vp for reading (as shown in FIG. 8) is applied through a plate line PL0 to ferroelectric capacitors FC1 and FC2.

The paired ferroelectric capacitors FC1 and FC2 are arranged to be in opposite polarized states each other. That is to say, both of the capacitors FC1 and FC2 are arranged that, when the voltage difference between their both ends are respectively zero, they are in opposite polarized states P1 and P2 as shown in FIG. 8.

For example, when the ferroelectric capacitor FC1 is in the polarized state P1, the ferroelectric capacitor FC2 is in the polarized state P2 (This state is assumed to correspond to the stored data "H."). On the other hand, when the ferroelectric capacitor FC1 is in the polarized state P2, the ferroelectric capacitor FC2 is in the polarized state P1 (This state is assumed to correspond to the stored data "L.").

A sensing amplifier SA is disposed between the paired bit lines BL0 and /BL0. The sensing amplifier SA determines which potential of the paired bit line BL0 or /BL0 is higher, and assumes the higher potential as H (logical 1) and the lower potential as L (logical 0). The on and off states of the sensing amplifier SA are controlled with lines SAEN and /SAEN. Here, the line /SAEN is a reversal signal line of the line SAEN.

The paired bit lines BL0 and /BL0 are connected to a bit line pre-charge circuit 22. Both of the paired bit lines BL0 and /BL0 are pre-charged to the ground potential by supplying a signal to a line PC.

The paired bit lines BL0 and /BL0 are also provided with a means (auxiliary memory cell) for reducing the imprint effect, or a latch circuit 24 for reversing data. The data reversing latch circuit 24 is constituted as a bridge circuit, with each of the four arms provided with a transistor.

One end of a capacitor C1 which is a first auxiliary memory cell and one end of a capacitor C2 which is a second auxiliary memory cell are respectively connected one pair of opposite corners of the bridge circuit. The other ends of the capacitors C1 and C2 are grounded. The other pair of opposite corners of the bridge circuit are respectively connected to the bit lines BL0 and /BL0.

Gates of one pair of opposite transistors of the bridge circuit are connected to a line PHI0 and the gates of the other pair of opposite transistors are connected to a line PHI1.

Therefore, when the line PHI0 is set to H, the capacitor C1 and the bit line BL0 are interconnected and the capacitor C2 and the bit line /BL0 are interconnected. On the other hand, when the line PHI1 is set to H, the capacitor C1 and the bit line /BL0 are interconnected and the capacitor C2 and the bit line BL0 are interconnected.

With appropriate control of the lines PHI0 and PHI1, it is possible to store the potentials of the paired bit lines BL0 and /BL0 as electric charges in the capacitors C1 and C2, or to reverse the high-low relationship between the bit lines BL0 and /BL0 and reverse again to the original relationship according to the electric charges stored in the capacitors C1 and C2.

Circuits in the vicinity of other bit lines BL1, /BL1, . . . are also similar to that shown in FIG. 2. In other words, in this embodiment, a plurality of memory cells, sensing amplifiers SA, bit pre-charge circuits 22, and data reversing latch circuit 24 are provided for each pair of bit lines.

Next, the imprint effect reducing operation at the time of reading data is described. For example, operation of reading from the memory cells M0, M1, . . . , Mm−1 is made by selecting the word line WL0 and the column selection line COL0 both shown in FIG. 1.

As described above, in this embodiment, the data reversing latch circuit is provided for each pair of bit lines. Therefore, when the memory cells M0, M1, . . . , Mm−1 are selected and read, the imprint reducing operation is made not only to the memory cells M0, M1, . . . , Mm−1 but also to memory cells Mx, Mx+1, . . . included in the row to which the memory cells M0, M1, . . . , Mm−1 belong.

The imprint effect reducing operation for the memory cell M0 for example will be hereinafter described with reference to FIG. 2 and a flow chart shown in FIG. 3. Here, it is assumed that data H to be stored is written (stored) in the memory cell M0. In other words, it is assumed that the ferroelectric capacitor FC1 constituting the memory cell M0 is in the polarized state P1 shown in FIG. 8 without a voltage applied, while the ferroelectric capacitor FC2 is in the polarized state P2.

First, loading capacitors (provided as parasitic capacitances of the bit lines BL0 and /BL0) are discharged by setting the line PC to H (as seen in FIG. 3(a)), thereby setting the bit lines BL0 and /BL0 to L. After that, the line PC is brought to L to bring the bit lines BL0 and /BL0) to floating state.

At the same time, the capacitors C1 and C2 are discharged by setting the lines PHI0 and PHI1 to H (as seen in FIG. 3(b)). After that, the lines PHI0 and PHI1 are brought to L to bring the capacitors C1 and C2 to the state of being disconnected from the bit lines BL0 and /BL0.

Next, transistors Q1 and Q2 are set to the on state by setting the word line WL0 to H as shown in FIG. 3(c). At the same time or immediately after that, the plate line PL0 is set to H as shown in FIG. 3(d), followed by setting the plate line PL0 back to L as shown in FIG. 3(e). As a result, a voltage corresponding to the data stored or written in the memory M0 appears on the bit lines BL0 and /BL0 as shown in FIG. 3(f).

Here, the sensing amplifier SA is actuated by setting the line SAEN to H (or the line /SAEN to L) as shown in FIG. 3(g).

The sensing amplifier SA determines which potential of the bit lines BL0 or /BL0 is higher, and assumes the higher potential as H and the lower potential as L. Here, the potential on the bit line BL0 is determined as higher than the potential on the bit line /BL0, and assumes the potential on the bit line BL0 as H while assuming the potential on the bit line /BL0 as L as shown in FIG. 3(h). The potential H on the bit line BL0 and the potential L on the bit line /BL0 are outputted outside through input-output lines IO0 and /IO0.

Figure 3:
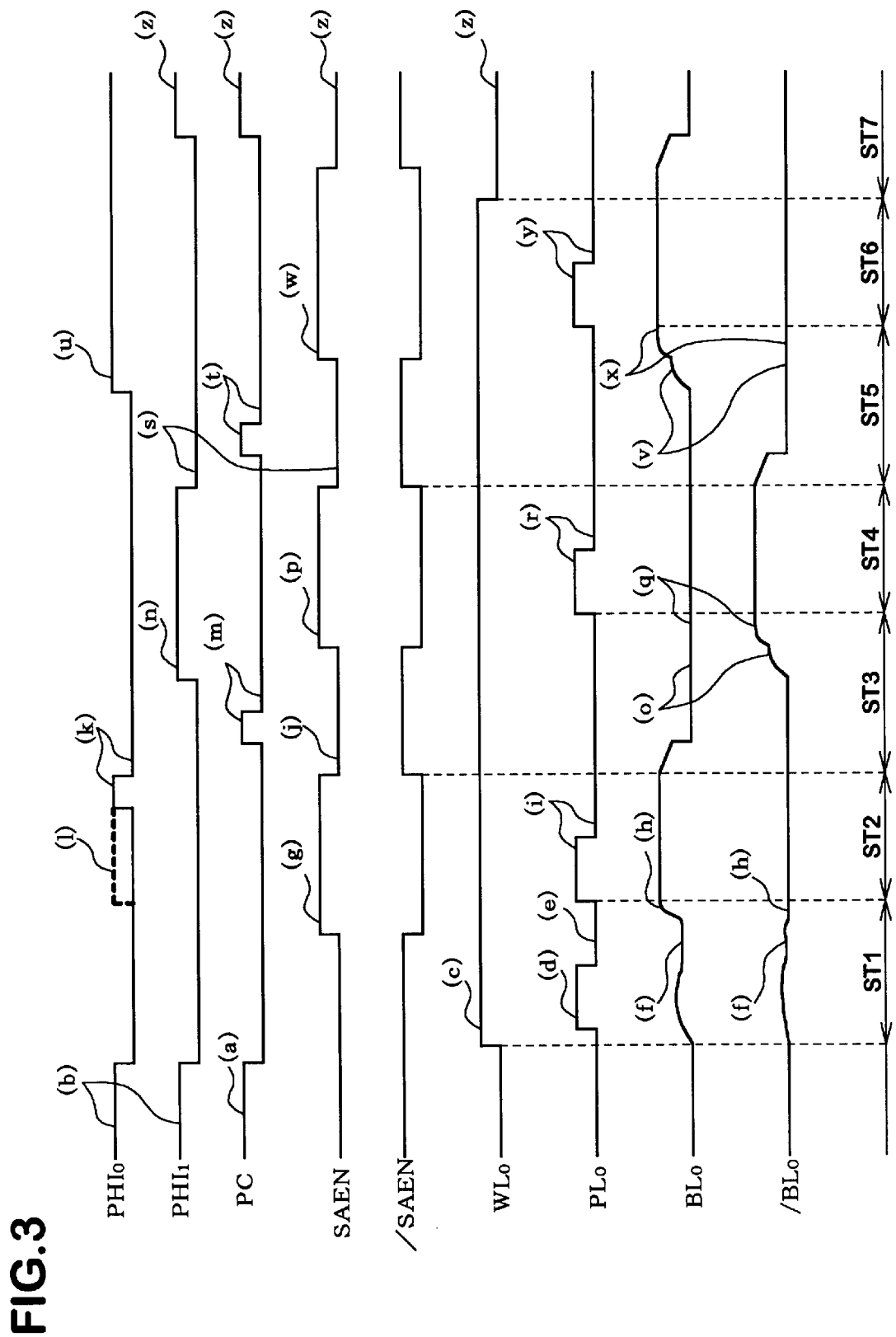
FIG. 3 is a timing chart for explaining the imprint effect reducing operation at the time of reading from the ferroelectric memory 20.

The step ST1 shown in FIG. 3 is for reading data.

Next, the plate line PL0 is set again to H, followed by setting the plate line PL0 back to L as shown in FIG. 3(i). As a result, the polarized state of the paired ferroelectric capacitors FC1 and FC2 is set back to the polarized state as before the reading operation.

After that, the operation of the sensing amplifier SA is finished by setting the line SAEN to L and the line /SAEN to H as shown in FIG. 3(j).

The step ST2 shown in FIG. 3 is for rewriting the data.

In the step ST2 in this embodiment, the line PHI0 is temporarily set to H after setting the PL0 back to L, and after that, the line PHI0 is set back to L as shown in FIG. 3(k) when the operation of the sensing amplifier SA is finished. As a result, the capacitor C1 may be brought to floating state after being charged with the potential of the bit line BL0, and the capacitor C2 may be brought to floating state after being charged with the potential of the bit line /BL0.

In the case of this example, since the potential of the bit line BL0 is H and the potential of the bit line /BL0 is L, the capacitor C1 is in charged state and the capacitor C2 is in discharged state. In other words, the capacitor C1 is in the state (charged state) corresponding to the polarized state P1 of the ferroelectric capacitor FC1 while the capacitor C2 is in the state (discharged state) corresponding to the polarized state P2 of the ferroelectric capacitor FC2. The charged or discharged state of the capacitors C1 and C2 corresponds to auxiliary information.

By the way, in this embodiment, while the timing of setting the line PHI0 to H is set to be after the plate line PL0 is set back to L, the timing is not limited to that but may be set for example to be immediately after the operation of the sensing amplifier SA is established, as shown with a broken line in FIG. 3(l).

Next, the line PC is temporarily set to H and then back to L as shown in FIG. 3(m). As a result, both of the bit lines BL0 and /BL0 are brought to floating state after discharging the loading capacitors (provided as the parasitic capacitors of the bit lines BL0 and /BL0 as described above).

After that, the line PHI1 is set to H as shown in FIG. 3(n). As a result, the bit line BL0 is connected to the capacitor C2 while the bit line /BL0 is connected to the capacitor C1. Therefore, the potential of the bit line BL0 connected to the capacitor C2 which has been made to discharged state in the step ST2 described above becomes the ground potential, and the potential of the bit line /BL0 connected to the capacitor C1 which has been made to the charged state in the step ST2 described above becomes higher than the ground potential as shown in FIG. 3(o).

Here, the sensing amplifier SA is actuated by setting the line SAEN to H and setting the line /SAEN to L as shown in FIG. 3(p).

The sensing amplifier determines that the potential on the bit line /BL0 is higher than that on the bit line BL0, and sets the potential on the bit line /BL0 to H while setting the potential on the bit line BL0 to L as shown in FIG. 3(q). In other words, the potentials on the bit lines BL0 and /BL0 are reversed from those in the step ST1 (data reading step).

The step ST3 shown in FIG. 3 is for reversing the data.

After that, the plate line PL0 is temporarily set to H and then set back to L as shown in FIG. 3(r). As a result, the polarized state of the paired ferroelectric capacitors FC1 and FC2 are reversed from that before the reading operation. In other words, the stored content in the memory cell M0 is rewritten from H to L.

By the way, at this time, the capacitor C1 is charged according to the potential on the bit line /BL0 while the capacitor C2 is charged according to the potential on the bit line BL0. Since the potential on the bit line /BL0 is H and that on the bit line BL0 is L, the capacitor C1 is in charged state and the capacitor C2 is in discharged state, similarly to the case of the step ST2 in which data is rewritten.

After that, the operation of the sensing amplifier SA is finished by setting the line SAEN to L and setting the line /SAEN to H. At the same time, the capacitors C1 and C2 are brought to the floating state by setting the line PHI1 back to L as shown in FIG. 3(s).

The step ST4 shown in FIG. 3 is for writing the reversed data.

Next, the line PC is temporarily set to H and then back to L as shown in FIG. 3(t). In this way, after discharging the loading capacitors given as the parasitic capacitors for both of the bit lines BL0 and /BL0, both of the bit lines BL0 and /BL0 are brought to floating state.

After that, the line PHI0 is set to H as shown in FIG. 3(u). As a result, the bit line BL0 is connected again to the capacitor C1 while the bit line /BL0 is connected to the capacitor C2. As a result, the potential on the bit line /BL0 connected to the capacitor C2 which has been made to discharged state in the step ST4 described above becomes the ground potential. On the other hand, the potential on the bit line BL0 connected to the capacitor C1 which has been made to charged state in the step ST4 described above becomes higher than the ground potential as shown in FIG. 3(v).

Here, the sensing amplifier SA is actuated by setting the line SAEN to H while setting the line /SAEN to L as shown in FIG. 3(w).

The sensing amplifier determines that the potential on the bit line BL0 is higher than that on the bit line /BL0, and sets the potential on the bit line BL0 to H while setting the potential on the bit line /BL0 to L as shown in FIG. 3($x$). In other words, the potentials on the bit lines BL0 and /BL0 are reversed from those in the step ST3 (data reversing step) and are the same as those in the step ST1 (data reading step).

The step ST5 shown in FIG. 3 is for reversing the data back to normal.

After that, the plate line PL0 is temporarily set to H and then back to L as shown in FIG. 3($y$). As a result, the polarized state of the paired ferroelectric capacitors FC1 and EC2 is brought back to that before the reading operation. In other words, the stored content in the memory cell M0 is rewritten from L back to H.

The step ST6 shown in FIG. 3 is for writing the data rewritten back to normal.

After that, the imprint effect reducing operation at the time of reading is finished by setting the word line WL0 and the line SAEN back to L, setting the line /SAEN back to H, and setting the line PHI1 and the line PC back to H as shown in FIG. 3($z$).

The step ST7 shown in FIG. 3 is for the finish.

In this way, at the time of reading the data written in the memory cell M0, the data stored in the memory cell M0 is temporarily changed from its original H to L, and again back to H. Therefore, the imprint effect on the ferroelectric capacitors FC1 and FC2 is reduced every time the data is read.

By the way, while the above embodiment is constituted to perform the imprint effect reducing operation (steps ST3 through ST6) only once per one reading operation, it may also be constituted to perform more than once per one reading operation.

Furthermore, while the above embodiment is explained for the case of writing the data H in the memory cell M0, the case of writing the data L may be similarly explained.

Furthermore, while the above explanation is made with the memory cell M0 as an example, the imprint effect reducing operation at the time of reading is performed also for other selected memory cells M1 through Mm−1.

Furthermore, in the above embodiment, since the latch circuit for reversing data is provided for each pair of bit lines, when the memory cells M1 through Mm−1 are selected and read, the imprint effect reducing operation is performed not only for the memory cells M1 through Mm−1, but also for all the other memory cells Mx, Mx+1, . . . included in the row to which those memory cells M1 through Mm−1 belong. Therefore, the imprint effect reducing operation is performed for a greater number of memory cells per one reading operation.

While the above embodiment is constituted to perform the imprint effect reducing operation automatically at the time of reading data, an alternative embodiment may be constituted to perform the imprint effect reducing operation automatically at the time of writing data. Still another alternative embodiment may be constituted to perform the imprint effect reducing operation automatically at the time of both writing and reading data.

Figure 4:
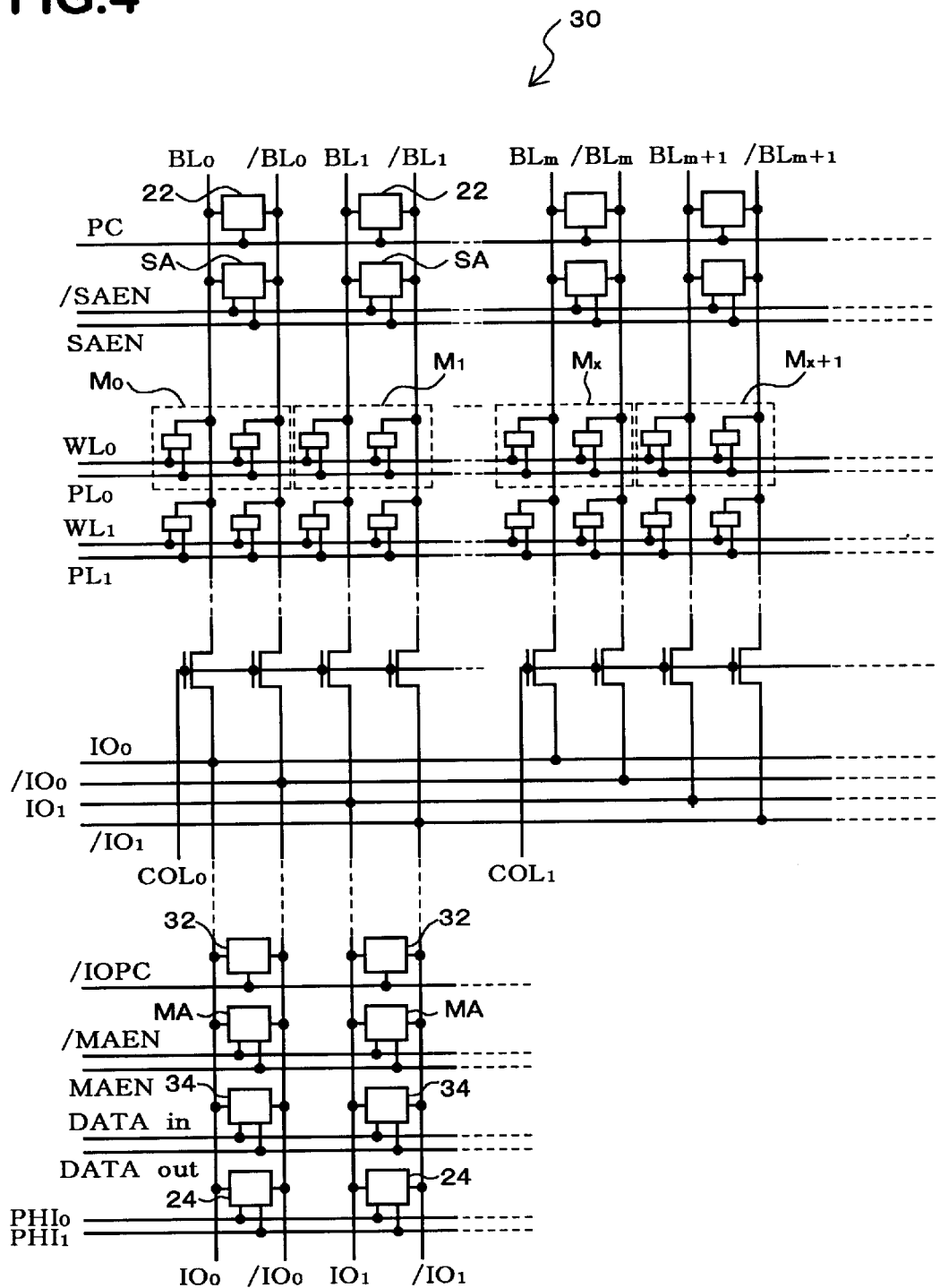
FIG. 4 is a partial view of the constitution of a ferroelectric memory 30 as another embodiment of this invention.

Second Embodiment:

Next, a constitution of a ferroelectric memory 30 as another form of embodying the invention is shown in FIG. 4. The ferroelectric memory 30 is in common with the above ferroelectric memory 20 for the point that they are constituted with a plurality of ferroelectric memory cells M0, M1, . . . arranged in rows and columns, and that each of the memory cells M0, M1, . . . is of a so-called 2-transistor, 2-capacitor type.

Also the ferroelectric memory 30 is in common with the above ferroelectric memory 20 for the point that each memory cell is disposed at the intersection of a word line and a pair of bit lines, and that m-number of memory cells may be accessed simultaneously. In other words, the m-number of memory cells that may be accessed simultaneously are selected with one word line and one column selection line.

Also the ferroelectric memory 30 is in common with the above ferroelectric memory 20 for the point that data transfer between the m-number of memory cells, for example M0, M1, . . . , Mm−1 (not shown) and the outside is performed through m-number pairs of communication lines or input-output lines IO0, /IO0, IO1, /IO1, . . . , IOm−1, /IOm−1 (not shown) and selected m-number pairs of bit lines BL0, /BL0, BL1, /BL1, . . . , BLm−1, /BLm−1 (not shown).

Also the ferroelectric memory 30 is in common with the ferroelectric memory 20 for the point that the former is provided with a plurality of memory cells, sensing amplifiers SA, and bit line pre-charge circuits 22, for each pair of bit lines.

However, the ferroelectric memory 30 shown in FIG. 4 is different from the ferroelectric memory 20 in that the former is provided with the data reversing latch circuit 24 for each pair of input-output lines (for example input-output lines IO0, /IO0), while the latter is provided with the data reversing latch circuit 24 for each pair of bit lines (for example bit lines BL0, /BL0) as shown in FIG. 1.

Figure 5:
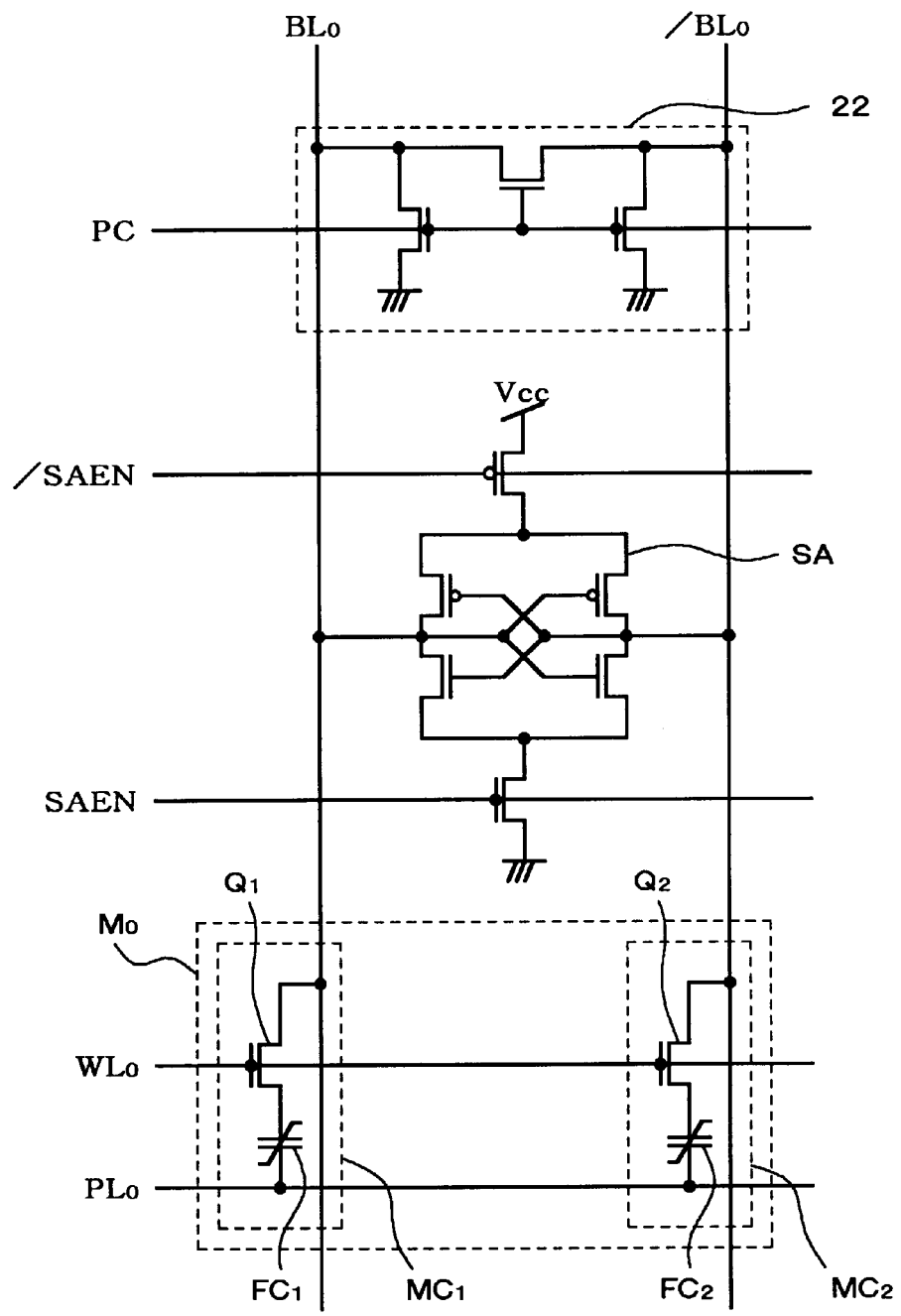
FIG. 5 is a detailed circuit diagram in the vicinity of a pair of bit lines BL0 and /BL0 constituting the ferroelectric memory 30 shown in FIG. 4.

FIG. 5 shows a detailed circuit diagram in the vicinity of a pair of bit lines BL0 and /BL0 of the ferroelectric memory 30. As described above, a plurality of memory cells M0, . . . , sensing amplifiers SA, and bit line pre-charge circuits 22 are disposed, but no data reversing latch circuit 24 is disposed on the bit lines BL0 and /BL0.

The constitution of the memory cells M0, . . . , sensing amplifier SA, and bit line pre-charge circuit 22 is the same as that in the ferroelectric memory 20.

Figure 6:
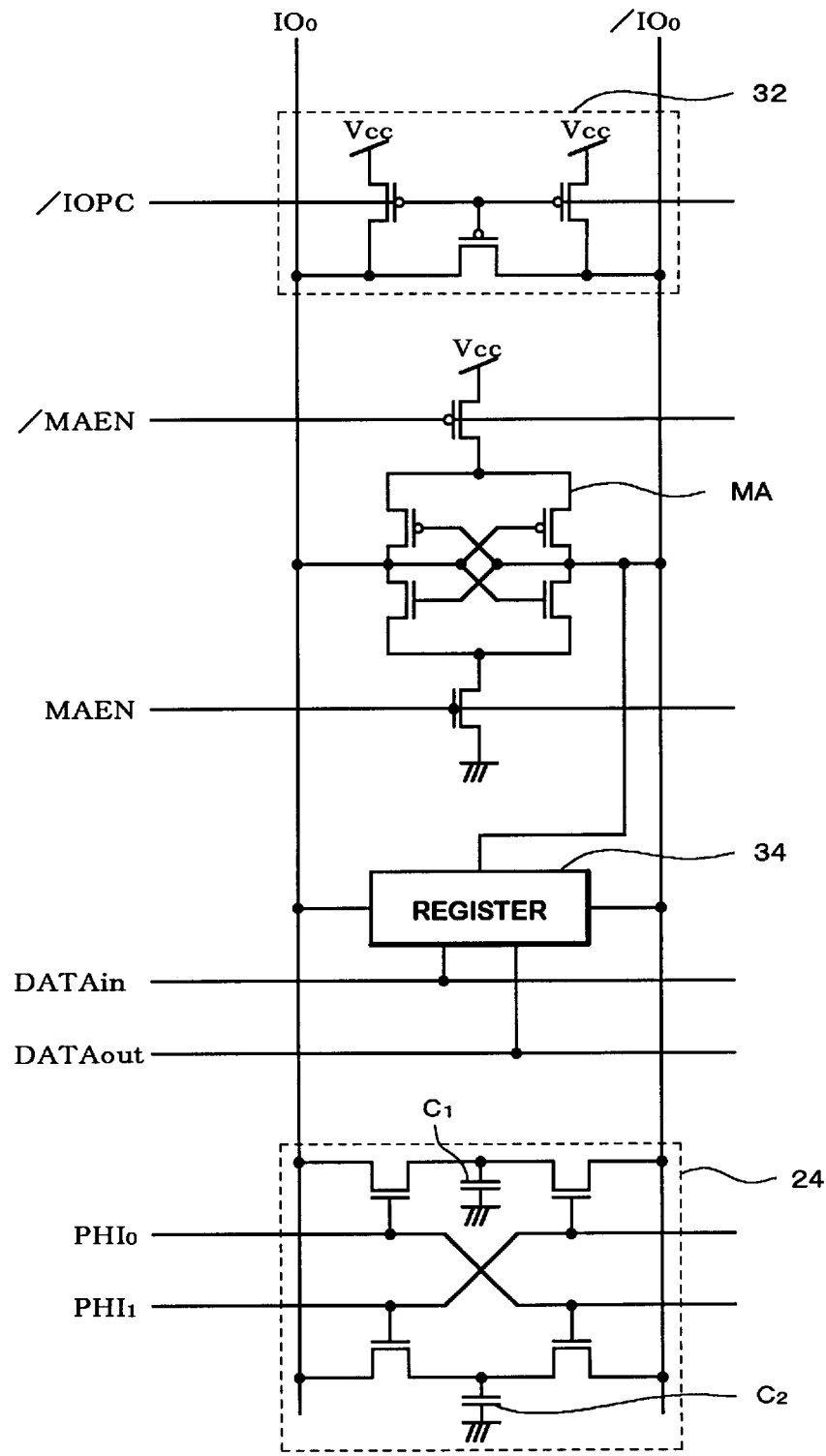
FIG. 6 is a detailed circuit diagram in the vicinity of a pair of input-output lines IO0 and /IO0 constituting the ferroelectric memory 30 shown in FIG. 4.

FIG. 6 shows a detailed circuit diagram in the vicinity of a pair of input-output lines IO0 and /IO0 of the ferroelectric memory 30. As described above, the data reversing latch circuit 24 is disposed on the paired input-output lines IO0 and /IO0. The constitution of the data reversing latch circuit 24 is the same as that in the ferroelectric memory 20 described above. The other pair of opposing corners of the bridge of the data reversing latch circuit 24 are respectively connected to the input-output lines IO0 and /IO0.

The pair of input-output lines IO0 and /IO0 are further connected to an input-output line pre-charge circuit 32, a main amplifier MA, and a register 34.

The constitution of the input-output line pre-charge circuit 32 is similar to that of the bit line pre-charge circuit 22 (shown in FIG. 5). In this embodiment, however, the input-output line pre-charge circuit 32 is constituted to pre-charge the pair of input-output lines IO0 and /IO0 to a power source potential by applying a signal to a line /IOPC.

The constitution of the main amplifier MA is the same as that of the sensing amplifier SA shown in FIG. 5.

The register 34 temporarily holds to-be-written data for 1 bit inputted from outside through a line DATAin and outputs at a specified timing to the input-output lines IO0 and /IO0. It also takes in at a specified timing and holds data for 1 bit which is read with the input-output lines /IO0 or IO0, and outputs the data to the outside through a line DATAout. By the way, an input-output permitting signal, and timing control signal for the register 34 are not shown in FIG. 6.

The circuits in the vicinity of other input-output lines IO1, /IO1, . . . , IOm−1, /IOm−1 have the same constitution as that of the circuit shown in FIG. 6. That is to say, in this embodiment, the data reversing latch circuit 24, input-output line pre-charge circuit 32, main amplifier MA, and register 34 are provided for each pair of input-output lines.

Next, the imprint effect reducing operation at the time of reading data from the ferroelectric memory 30 will be described. A case will be described in which the memory cells M0, M1, . . . , Mm−1 are read by selecting the word line WL0 and column selection line COL0 shown in FIG. 4.

In this embodiment described above, the data reversing latch circuit 24 is provided for each pair of input-output lines. Therefore, when the memory cells M0, M1, . . . , Mm−1 are selected and read, the imprint effect reducing operation is performed for the selected memory cells M0, M1, . . . , Mm−1 only. Therefore, this embodiment is different from the ferroelectric memory 20 shown in FIG. 1 in that the imprint effect reducing operation is not performed for the memory cells Mx, Mx+1, . . . that are not selected even if they are included in the same row in which the memory cells M0, M1, . . . , Mm−1 are included.

The imprint effect reducing operation at the time of reading will be hereinafter described with the memory cell M0 as an example in reference to FIG. 5, FIG. 6, and a flow chart shown in FIG. 7. Like the above-described embodiment, it is assumed that data H to be stored or information to be stored has been written in the memory M0.

First, the loading capacitors (not shown, given as parasitic capacitances of the bit lines BL0 and /BL0) are discharged by setting the bit lines BL0 and /BL0 to L by setting the line PC to H as shown in FIG. 7(a). After that, the bit lines BL0 and /BL0 both are brought to floating state by setting the line PC to L.

Figure 7:
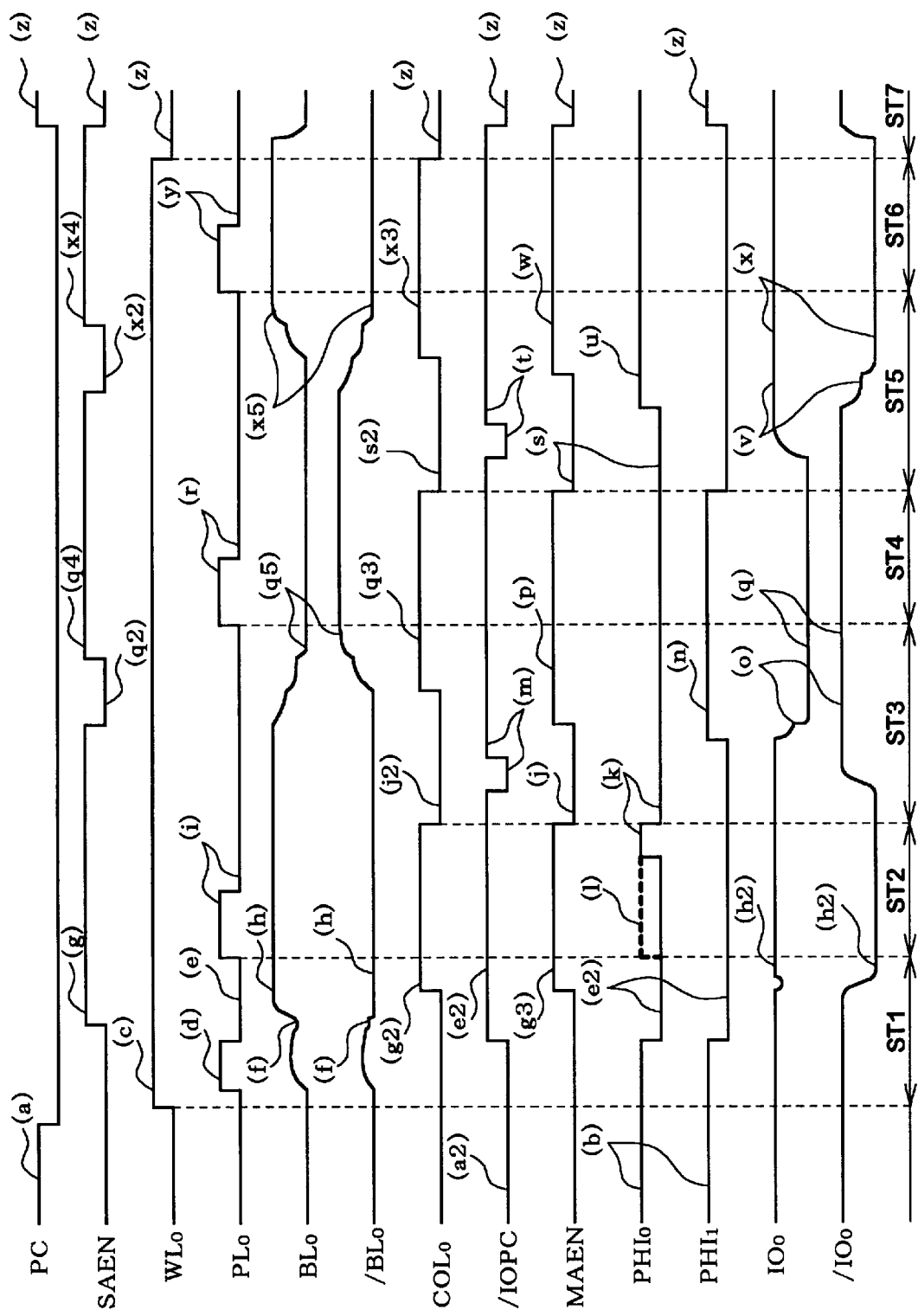
FIG. 7 is a timing chart for explaining the imprint effect reducing operation at the time of reading from the ferroelectric memory 30.

On the other hand, the capacitors C1 and C2 are pre-charged to a power source potential by setting the input-output lines IO0 and /IO0 to H and setting the lines PHI0 and PHI1 to H as shown in FIG. 7(b) by setting the line /IOPC to L as shown in FIG. 7(a2). Here, since the column selection line COL0 is still at L, the bit lines BL0 and /BL0 are not connected to the input-output lines IO0 and /IO0.

Next, transistors Q1 and Q2 are set to on state by setting the word line WL0 to H as shown in FIG. 7(c). At the same time or immediately after that, the plate line PL0 is set to H as shown in FIG. 7(d) and then back to L as shown in FIG. 7(e). As a result, a voltage corresponding to the stored data H written in the memory M0 appears on the bit lines BL0 and /BL0 as shown in FIG. 7(f).

Here, the sensing amplifier SA is actuated by setting the line SAEN to H as shown in FIG. 7(g). Like the previous embodiment, the line /SAEN is the reverse signal line of the line SAEN.

The sensing amplifier SA determines which potential on the bit line BL0 or /BL0 is higher, and assumes the higher potential as H and the lower potential as L. Here, the potential on the bit line BL0 is determined to be higher than that on the bit line /BL0 and assumed as H, and the potential on the bit line /BL0 is assumed as L as shown in FIG. 7(h).

On the other hand, almost simultaneously with setting the plate line PL0 back to L as shown in FIG. 7(e), the line /IOPC is set to H, and the lines PHI0 and PHI1 are set to L as shown in FIG. 7(e2).

Both of the input-output lines IO0 and /IO0 are brought to floating state by setting the line /IOPC to H. Capacitors C1 and C2 pre-charged to the power source potential are also brought to floating state by setting the lines PHI0 and PHI1 to L.

After setting the line SAEN to H as shown FIG. 7(g) and then setting the column selection line COL0 to H as shown in FIG. 7(g2) to connect the bit lines BL0 and /BL0 to the input-output lines IO0 and /IO0, and at the same time the main amplifier MA is actuated by setting the line MAEN to H as shown in FIG. 7(g3). Here, the line /MAEN is the reverse signal line of the line MAEN.

As a result, the potential on the input-output line IO0 connected to the bit line BL0 at the potential H becomes H, and the potential on the input-output line /IO0 connected to the bit line /BL0 at the potential L becomes L as shown in FIG. 7(h2).

The potential H on the input-output line IO0 and the potential L on the input-output line /IO0 are outputted outside through the register 34 and the line DATout.

The step ST1 shown in FIG. 7 is for reading the data.

Next, the plate line PL0 is set again to H and then back to L as shown in FIG. 7(i). As a result, the polarized state of the paired ferroelectric capacitors FC1 and FC2 is restored to the polarized state as before the reading operation.

The step ST2 shown in FIG. 7 is for rewriting the data.

In the step ST2 of the above embodiment, the line PHI0 is temporarily set to H after setting the line PHI0 to L, and then back to L as shown in FIG. 7(k). As a result, the capacitor C1 may be brought to floating state after charging the capacitor C1 according to the potential on the input-output line IO0, and at the same time, the capacitor C2 may be brought to floating state after charging the capacitor C2 according to the potential on the input-output line /IO0.

In the case of this example, since the potential of the input-output line IO0 is H and the potential of the input-output line /IO0 is L, the capacitor C1 is in charged state and the capacitor C2 is in discharged state. In other words, the capacitor C1 is in the state (charged state) corresponding to the polarized state P1 of the ferroelectric capacitor FC1 while the capacitor C2 is in the state (discharged state) corresponding to the polarized state P2 of the ferroelectric capacitor FC2. The charged or discharged state of the capacitors C1 and C2 corresponds to auxiliary information.

When the line PHI0 is set back to L, the operation of the main amplifier MA is stopped by setting the line MAEN to L as shown in FIG. 7(j) while the bit lines BL0 and /BL0 are disconnected from the input-output lines IO0 and /IO0 by setting the column selection line COL0 to L as shown in FIG. 7(j2). As a result, the input-output lines IO0 and /IO0 are brought to floating state.

While the timing of setting the line PHI0 to H is set to be after the plate line PL0 is set to L in this embodiment, the timing of setting the line PHI0 to H is not limited to that. For example, it may be constituted that the line PHI0 is set to H immediately after the operation of the main amplifier MA is established as shown with the broken line in FIG. 7(l).

Next, the line /IOPC is temporarily set to L and then back to H as shown in FIG. 7(m). As a result, both of the input-output lines IO0 and /IO0 may be set to H and then to floating state.

After that, the line PHI1 is set to H as shown in FIG. 7(n). As a result, the input-output line IO0 is connected to the capacitor C2 and the input-output line /IO0 is connected to the capacitor C1. Therefore, the potential on the input-output line IO0 connected to the capacitor C2 which has been brought to discharged state in the step ST2 described above becomes lower than the power source voltage, while the potential on the input-output line /IO0 connected to the capacitor C1 which has been brought to charged state in the step ST2 described above becomes the power source voltage as shown in FIG. 7(o).

Here, the main amplifier MA is actuated by setting the line MAEN to H as shown in FIG. 7(p).

The main amplifier MA determines that the voltage on the input-output line /IO0 is higher than that on the input-output line IO0, and sets the voltage on the input-output line /IO0 to H and the voltage on the input-output line IO0 to L as shown in FIG. 7(q).

After that, the operation of the sensing amplifier SA is temporarily stopped by setting the line SAEN to L as shown in FIG. 7(q2) and then the column selection line COL0 is set to H as shown in FIG. 7(q3) to connect the bit lines BL0 and /BL0 to the input-output lines IO0 and /IO0. After that, the sensing amplifier SA is actuated again by setting the line SAEN to H as shown in FIG. 7(q4).

As a result, the potential on the bit line BL0 connected to the input-output line IO0 which has been set to the potential L becomes L, and the potential on the bit line /BL0 connected to the input-output line /IO0 which has been set to the potential H becomes H as shown in FIG. 7(q5). In short, the potentials on the paired bit lines BL0 and /BL0 are reversed from those in the step ST1 (data reading step).

The step ST3 shown in FIG. 7 is for reversing the data.

After that, the plate line PL0 is temporarily set to H and then back to L as shown in FIG. 7(r). As a result, the polarized state of the paired ferroelectric capacitors FC1 and FC2 is reversed from that before the reading operation. In other words, the contents stored in the memory cell M0 is rewritten from H to L.

By the way, at this time, the capacitor C1 is charged according to the potential on the input-output line /IO0 while the capacitor C2 is discharged according to the potential on the input-output line IO0. Since the potential on the input-output line /IO0 is H and that on the input-output line IO0 is L, the capacitor C1 is in charged state and the capacitor C2 is in discharged state, like the case of the step ST2 in which data is written again.

After that, the operation of the main amplifier MA is finished by setting the line MAEN to L. At the same time, the capacitors C1 and C2 are brought to floating state by setting the line PHI1 back to L as shown in FIG. 7(s). At the same time, the bit line BL0 and /BL0 are disconnected from the input-output lines IO0 and /IO0 by setting the column selection line COL0 to L as shown in FIG. 7(s2). As a result, the input-output lines IO0 and /IO0 are brought to floating state.

The step ST4 shown in FIG. 7 is for writing the reversed data.

Next, the line /IOPC is temporarily set to L and then back to H as shown in FIG. 7(t). As a result, the input-output lines IO0 and /IO0 both are set to H and then brought to floating state.

After that, the line PHI0 is set to H as shown in FIG. 7(u). As a result, the input-output line IO0 is connected again to the capacitor C1 and the input-output line /IO0 is connected to the capacitor C2. As a result, the potential on the input-output line /IO0 connected to the capacitor C2 which has been brought to discharged state in the step ST4 described above becomes lower than the power source potential, while the potential on the input-output line IO0 connected to the capacitor C1 which has been brought to charged state in the step ST4 described above becomes the power source potential as shown in FIG. 7(v).

Here, the main amplifier MA is actuated by setting the line MAEN to H as shown in FIG. 7(w).

The main amplifier MA determines that the potential on the input-output line IO0 is higher than that on the input-output line /IO0, and sets the potential on the input-output line IO0 to H while setting the potential on the input-output line /IO0 to L as shown in FIG. 7(x).

After that, the operation of the sensing amplifier SA is temporarily stopped by setting the line SAEN to L as shown in FIG. 7(x2) and then the column selection line COL0 is set to H as shown in FIG. 7(x3) to connect the bit lines BL0 and /BL0 to the input-output lines IO0 and /IO0. After that, the sensing amplifier SA is actuated again by setting the line SAEN to H as shown in FIG. 7(x4).

As a result, the potential on the bit line BL0 connected to the input-output line IO0 which has been set to the potential H becomes H, and the potential on the bit line /BL0 connected to the input-output line /IO0 which has been set to the potential L becomes L as shown in FIG. 7(x5). In short, the potentials on the paired bit lines BL0 and /BL0 are reversed from those in the step ST3 (data reversing step) and are the same as those in the step ST1 (data reading step).

The step ST5 shown in FIG. 7 is for reversing the data back to normal.

After that, the plate line PL0 is temporarily set to H and then back to L as shown in FIG. 7(y). As a result, the polarized state of the paired ferroelectric capacitors FC1 and FC2 is returned back to the same as that before the reading operation. In other words, the contents stored in the memory cell M0 is rewritten from L back to H.

By the way, at this time, the capacitor C1 is charged according to the potential on the input-output line IO0 while the capacitor C2 is charged according to the potential on the input-output line /IO0. Since the potential on the input-output line IO0 is H and that on the input-output line /IO0 is L, the capacitor C1 is in charged state and the capacitor C2 is in discharged state, similarly to the case of the step ST4 in which the reversed data is written again.

The step ST6 shown in FIG. 7 is for writing the data rewritten back to normal.

After that, the imprint effect reducing operation at the time of reading is finished by setting the word line WL0, column selection line COL0, line /IOPC, line MAEN, and line SAEN back to L, and setting the lines PHI1 and PC back to H as shown in FIG. 7(z).

The step ST7 shown in FIG. 7 is for the finish.

By the way, like the previous embodiment shown in FIGS. 1 and 3, it may also be constituted that the imprint effect reducing operation (in the steps ST3 through ST6) is repeated two or more times per one reading.

Also like the previous embodiment shown in FIGS. 1 and 3, it may be constituted that the imprint effect reducing operation is performed automatically at the time of writing data. Also, it may be constituted that the imprint effect reducing operation may be automatically performed for both writing and reading.

Other Forms of Embodying the Invention:

While the above embodiment is described as an example constitution in which a plurality of ferroelectric memory cells are accessed at a time for reading or writing data, the description may also be applied to the constitution of ferroelectric memory device in which only a single ferroelectric memory cell is accessed at a time for reading or writing data.

Furthermore, while the cases are described above in which the auxiliary memory cells are disposed to correspond to each column of ferroelectric elements arranged in rows and columns, or disposed to correspond to data communication lines, the disposition of the auxiliary memory cells is not limited to those described above.

Furthermore, while the above embodiment is described with an example of ferroelectric memory device in which a plurality of ferroelectric memory cells are arranged in rows and columns, the present invention is not limited to the above embodiment but may be embodied in other forms comprising only one ferroelectric element, or several, or several hundred ferroelectric elements.

While the data reversing latch circuit 24 is shown as an example with the bridge circuit used as the auxiliary memory cell in each of the above embodiments, the auxiliary memory cell is not limited to such a circuit.

In each of the above embodiments, while the capacitors are used as the first and second auxiliary memory elements constituting the auxiliary memory cell, elements other than capacitors may also be used as the first and second auxiliary memory elements. Also, the auxiliary memory cell may not necessarily be provided with the first and second auxiliary memory elements.

In each of the above embodiments, while the case of using the auxiliary memory cell as a means for performing the imprint effect reducing operation is described as an example, the means for performing the imprint effect reducing operation is not limited to the auxiliary memory cell.

The ferroelectric memory device described above as an embodiment is provided with ferroelectric memory cells of the so-called 2-transistor, 2-capacitor type. However, this invention is not limited to such an embodiment but may also be applied for example to ferroelectric memory devices having ferroelectric memory cells of the 1-transistor, 1-capacitor type or to the ferroelectric memory device having ferroelectric memory cells of the 1-transistor type such as MFMIS-FET (metal ferroelectric metal isolator silicon FET).

Furthermore, the ferroelectric memory device described above as an embodiment is provided with ferroelectric memory cells capable of holding two kinds of polarized states corresponding to two kinds of information H and L. However, this invention is not limited to the above but may also be applied for example ferroelectric memory devices having ferroelectric memory cells capable of holding three kinds of polarized states corresponding to three kinds of information H, M, and L. In that case, if the information written in the ferroelectric memory cell is H for example, it has only to be constituted that the information is rewritten for example to M, L, and to H.

This invention is characterized in that, when data is written or read, the polarized state of the ferroelectric memory cell is changed to a polarized state that is different from that which is to be held, and then back to the original polarized state.

Therefore, the imprint effect reducing operation is automatically repeated for a specified number of times when data is written or read. Thus, the imprint effect on the ferroelectric memory cells is automatically performed as data is written or read.

This invention is characterized in that auxiliary memory cells are provided for storing auxiliary information corresponding to the polarized state to be held of the ferroelectric memory cells, and that the imprint effect reducing operation is performed according to the contents of the auxiliary information stored in the auxiliary memory cells.

Therefore, the imprint effect reducing operation is securely performed according to the contents of the auxiliary information, and the information to be stored in the ferroelectric memory cells is securely changed back to the original information.

This invention is characterized in that the polarized state of the first ferroelectric memory element is changed according to the auxiliary information stored in the second auxiliary memory element and that the polarized state of the second ferroelectric memory element is changed according to the auxiliary information stored in the first auxiliary memory element, and then the polarized state of the first ferroelectric memory element is changed back to the original polarized state according to the auxiliary information stored in the first auxiliary memory element, and the polarized state of the second ferroelectric memory element is changed back to the original polarized state according to the auxiliary information stored in the second auxiliary memory element.

Therefore, the imprint effect of the ferroelectric memory cell may be reduced by temporarily changing the corresponding relationship between the memory elements constituting the memory cell and the auxiliary memory cell. As a result, the imprint effect reducing operation is easily performed.

According to the invention, the first and the second ferroelectric memory elements both are provided with ferroelectric capacitors, and the first and the second auxiliary memory elements both are provided with capacitors. Therefore, the imprint effect of the ferroelectric memory cell is reduced by temporarily changing the connection relationship through electric communication paths between the capacitors constituting both of the memory cells. As a result, the imprint effect reducing operation is performed more easily.

This invention is characterized with a constitution in which a means for performing the imprint effect reducing operation is provided to correspond to the data communication line and the imprint reducing operation for the ferroelectric memory cell selected from among the ferroelectric memory cells arranged in rows and columns is repeated for a specified number of times when data is written or read.

Therefore, when data is written or read, operation for reducing the imprint effect of the selected ferroelectric memory cell is automatically performed.

This invention is characterized with a constitution in which a means for performing the imprint effect reducing operation is provided to correspond to each column of the arrangement in rows and columns and, when information is written or read, the imprint effect reducing operation is repeated for a specified number of times for the ferroelectric memory cell included in the row to which the ferroelectric memory cell selected from among the ferroelectric memory cells arranged in rows and columns belongs.

Therefore, it is possible to perform the imprint effect reducing operation automatically, when information is written or read, not only for the selected ferroelectric memory cell but for all the ferroelectric memory cells included in the row to which the selected ferroelectric memory cell belongs. As a result, at the time of writing or reading for one time, the imprint effect reducing operation is performed for more number of ferroelectric memory cells.

While this invention is described in reference to preferable embodiments, each term is used not for the purpose of limitation but for explanation, and therefore this invention may be modified within the scope of appended claims without departing from the scope and spirit of the invention.

What is claimed is:

1. A ferroelectric memory device comprising at least one ferroelectric memory cell storing information by holding a polarized state corresponding to said information, and means for performing steps of changing the polarized state of said ferroelectric memory cell to a state which is different from the polarized state to be held, and changing the polarized state thereof back to the original polarized state, wherein said performing means provides an imprint effect reducing operation.

2. A ferroelectric memory device as claimed in claim 1, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

3. A ferroelectric memory device as claimed in claim 1, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

4. A ferroelectric memory device as claimed in claim 1, wherein said performing means comprises at least one auxiliary memory cell provided for storing auxiliary information corresponding to the polarized states to be held of said ferroelectric memory cell, so that the imprint effect reducing operation is performed according the contents of the auxiliary information stored in said auxiliary memory cell.

5. A ferroelectric memory device of claim 4, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to said data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

6. A ferroelectric memory device as claimed in claim 4, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

7. A ferroelectric memory device as claimed in claim 4, wherein said ferroelectric memory cell is provided with first and second ferroelectric memory elements for holding polarized states different from each other, and wherein said auxiliary memory cell is provided with a first auxiliary memory element for storing information corresponding to the polarized state to be held in said first ferroelectric memory element, and with a second auxiliary memory element for storing information corresponding to the polarized state to be held in said second ferroelectric memory element, the polarized state of said first ferroelectric memory element being changed according to said auxiliary information stored in said second auxiliary memory element with the polarized state of said second ferroelectric memory element being changed according to the auxiliary information stored in said first auxiliary memory element, and the polarized state of said first ferroelectric memory element being subsequently changed back to the original state according to the auxiliary information stored in said first auxiliary memory element and the polarized state of said second ferroelectric memory element being changed back to the original state according to the auxiliary information stored in said second auxiliary memory element.

8. A ferroelectric memory device as claimed in claim 7, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to said data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

9. A ferroelectric memory device as claimed in claim 7, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

10. A ferroelectric memory device as claimed in claim 7, wherein each of said first and said second ferroelectric memory elements is provided with a ferroelectric capacitor, and wherein each of said first and said second auxiliary memory elements is provided with a capacitor, the polarized state of said first ferroelectric memory element being changed according to the auxiliary information stored in said second auxiliary memory element by interconnecting said second auxiliary memory element and said first ferroelectric memory element through an electric communication path, with the polarized state of said second ferroelectric memory element being changed according to the auxiliary information stored in said first auxiliary memory element by interconnecting said first auxiliary memory element and said second ferroelectric memory element through said electric communication path, and polarized state of said first ferroelectric memory element being subsequently changed back to the original state according to the auxiliary information stored in said first auxiliary memory element by interconnecting said first auxiliary memory element and said first ferroelectric memory element through said electric communication path, and the polarized state of said second ferroelectric memory element being changed back to the original state according to the auxiliary information stored in said second auxiliary memory element by interconnecting said second auxiliary memory cell and said second ferroelectric memory element through said electric communication path.

11. A ferroelectric memory device as claimed in claim 10, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to said data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

12. A ferroelectric memory device as claimed in claim 10, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

13. A ferroelectric memory device as claimed in claim 10, wherein said electric communication path includes a first bit line and a second bit line, one end of said ferroelectric capacitor constituting said first ferroelectric memory element being substantially connected through a first transistor to said first bit line, one end of said ferroelectric capacitor constituting said second ferroelectric memory element being substantially connected through a second transistor to said second bit line, with the other end of each of said paired ferroelectric capacitors being connected to a plate line.

14. A ferroelectric memory device as claimed in claim 13, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to said data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

15. A ferroelectric memory device as claimed in claim 13, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

16. A ferroelectric memory device as claimed in claim 13, wherein said performing means comprises a bridge circuit having four arms each provided with a transistor, one end of said capacitor constituting said first auxiliary memory element and one end of said capacitor constituting said second auxiliary memory element being substantially connected respectively to one diagonally opposite pair of corners of said bridge circuit, with the other ends of said pair of capacitors being substantially grounded, and said first and said second bit lines being respectively connected to the other diagonally opposite corners of said bridge circuit.

17. A ferroelectric memory device as claimed in claim 16, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to said data communication lines which are provided for writing data to or reading data from said selected ferroelectric memory cell, so that, when information is written or read, the imprint effect reducing operation is performed for a specified number of times for said ferroelectric memory cell selected from among said ferroelectric memory cells arranged in rows and columns.

18. A ferroelectric memory device as claimed in claim 16, wherein a plurality of said ferroelectric memory cells are arranged in rows and columns so that a desired ferroelectric memory cell may be selected from among said ferroelectric memory cells arranged in rows and columns, and wherein said performing means provides the imprint effect reducing operation to correspond to each column of the row-and-column arrangement, so that, when information is written or read, the imprint effect reducing operation is performed for a specified number of times for said ferroelectric memory cells included in the row to which said ferroelectric memory cell selected from among said ferroelectric memory cells arranged in rows and columns belongs.

19. A method of reducing imprint effect of a ferroelectric memory cell capable of storing information by holding a polarized state corresponding to said information, said method comprising performing, when said information is written or read, an operation for a specified number of times, said operation comprising the steps of setting said ferroelectric memory cell to a state which is different from said polarized state to be held and then setting said ferroelectric memory cell back to said polarized state to be held.

* * * * *